United States Patent
Takahashi et al.

(10) Patent No.: US 6,692,982 B2
(45) Date of Patent: Feb. 17, 2004

(54) OPTICAL SEMICONDUCTOR INTEGRATED CIRCUIT DEVICE AND MANUFACTURING METHOD FOR THE SAME

(75) Inventors: Tsuyoshi Takahashi, Ora-gun (JP); Toshiyuki Okoda, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/355,220

(22) Filed: Jan. 31, 2003

(65) Prior Publication Data
US 2003/0143774 A1 Jul. 31, 2003

(30) Foreign Application Priority Data
Jan. 31, 2002 (JP) .................................. 2002-023779

(51) Int. Cl.$^7$ .............................................. H01L 21/00
(52) U.S. Cl. ..................... 438/69; 438/41; 438/335; 438/336; 438/48; 257/E21.108; 257/184; 257/187; 257/E27.188; 257/462; 372/50; 372/43; 372/36
(58) Field of Search ............... 438/69, 41, 335, 438/336, 503, 504, 48; 257/E21.108, 184, 187, 197, 198, 462, 466, E27.128, E31.109, E27.12, 93, 102; 372/50, 43, 36

(56) References Cited

FOREIGN PATENT DOCUMENTS

| JP | 09-18050 | | 1/1997 | |
| JP | 2003-258216 A | * | 9/2003 | ............ H01L/27/14 |
| JP | 2003-258219 A | * | 9/2003 | ............ H01L/27/14 |

* cited by examiner

*Primary Examiner*—Matthew Smith
*Assistant Examiner*—Belur Keshavan
(74) *Attorney, Agent, or Firm*—Rothwell, Figg, Ernst & Manbeck

(57) ABSTRACT

In an optical semiconductor integrated circuit device in which a vertical pnp transistor and a photodiode are formed, the preferred embodiments of the present invention eliminates difficulty in performance improvement of the two elements. In an illustrative optical semiconductor integrated circuit device, a vertical pnp transistor and a photodiode have been formed, and first and second epitaxial layers and are stacked without doping. This enables a depletion layer forming region to be remarkably increased in the photodiode, and high-speed response becomes possible. Additionally, in the vertical pnp transistor, an n+ type diffusion region surrounds the transistor forming region. This can remarkably improve voltage endurance of the vertical pnp transistor 21.

16 Claims, 6 Drawing Sheets

OPTICAL SEMICONDUCTOR INTEGRATED CIRCUIT DEVICE AND MANUFACTURING METHOD FOR THE SAME

Priority is claimed to Japanese Patent Application Serial Number JP2002-023779, filed on Jan. 31, 2002, the disclosure of which is incorporated herein by reference in its entirety.

BACKGROUND OF THE INVENTION

1. Field of the Invention

The preferred embodiments of the present invention relate to an optical semiconductor integrated circuit device that includes a photodiode and a manufacturing method for the same. In some preferred embodiments, the photodiode and a bipolar IC are integrated and the bipolar IC is formed in nondoped epitaxial layers, which can, for example, enable high-speed response of the photodiode.

2. Description of the Related Art

The following description sets forth the inventors' knowledge of related art and problems therein and should not be construed as an admission of knowledge in the prior art. In, for example, an optical semiconductor integrated circuit device in which a photodetector and peripheral circuitry are monolithically formed, in comparison to that in which a photodetector and circuit elements are separately formed to construct a hybrid IC, a reduction in cost can be expected. On the other hand, the hybrid IC type can have an advantage in that it can be resistant against noise caused by external electromagnetic fields.

An embodiment of a conventional optical semiconductor integrated circuit device is disclosed in Japanese Unexamined Patent Publication No. H09-018050. Hereinafter, this structure will be described with reference to FIG. 11.

FIG. 11 is a sectional view of a conventional optical semiconductor integrated circuit (IC) device. More specifically, FIG. 11 is a sectional view of an IC in which a photodiode 1 and an npn transistor 2 are monolithically formed. As shown in FIG. 11, on the p type single crystal silicon semiconductor substrate 3, a first epitaxial layer 4 stacked by vapor-phase growth without doping is formed to a thickness of, for example, 15 to 20 $\mu$m. Likewise, on this first epitaxial layer 4, a second epitaxial layer 5 stacked by vapor-phase growth with phosphorus doping is formed to a thickness of, for example, 4 to 6 $\mu$m. The first and second epitaxial layers 4 and 5 are electrically isolated into a first island region 7 and a second island region 8 by a p+ type isolating region 6. In the first island region 7, a photodiode 1 is formed, and in the second island region 8, an npn transistor 2 is formed.

In the first island region 7, an n+ type diffusion region 9, which serves as a cathode exit, is formed on almost the entire surface of the second epitaxial layer 5. An oxide film 10 is also formed on the surface of this second epitaxial layer 5. Furthermore, a cathode electrode 11 comes into contact with the n+ type diffusion region 9 through a contact hole partially made in oxide film 10. The isolating region 6 is regarded as an anode side low resistance extracting region of the photodiode 1. An anode electrode 12 comes into contact with the surface of the isolating region 6. As a result, a photodiode 1 is constructed.

In the second island region 8, at the boundary between the first epitaxial layer 4 and the second epitaxial layer 5, there is embedded an n+ type layer 13. On the surface of the second epitaxial layer 5 above this n+ type embedded layer 13, a p type base region 14 of the npn transistor 2, an n+ type emitter region 15, and an n+ type collector region 16 are formed. An aluminum (Al) electrode 17 makes contact with the upper surfaces of the respective diffusion regions, and an Al layer extending on the oxide film 10 joins the respective elements. As a result, the npn transistor 2 is constructed. The photodiode 1 composes a light signal input part, and the npn transistor 2 composes a signal processing circuit in conjunction with other elements.

As mentioned above, in the conventional optical semiconductor integrated circuit device, the first epitaxial layer 4 is formed without doping, and the second epitaxial layer 5 is formed by doping phosphorus. Therefore, the photodiode 1 is constructed as a pin diode, and the nondoped first epitaxial layer 4 is formed as a depletion layer forming region. With this structure, the junction capacitance is suppressed, the light absorption is improved, occurrence of carriers outside the depletion layer is suppressed, and the response speed of the photodiode 1 is improved.

In order to further improve the response speed of the photodiode 1 while a depletion layer forming region in the photodiode 1 is secured, it is considered that the second epitaxial layer 5 is also formed without doping. In this case, if only the performance of the photodiode 1 is considered, satisfactory effects can be obtained. However, the npn transistor 2 side monolithically formed has the following problems. Because the second epitaxial layer 5 at the npn transistor 2 side is formed without doping, no pn junction region exists between the p type base region 14 and p+ type isolating region 6, and the structure of the second epitaxial layer also becomes a high resistance condition. Therefore, inversion and parasitic influence easily occur at the surface of the second epitaxial layer region between the base region 14 and the isolating region 6.

SUMMARY OF THE PREFERRED EMBODIMENTS

The preferred embodiments of the present invention have been developed in view of the above mentioned and/or other conventional problems. An optical semiconductor integrated circuit device, according to some preferred embodiments of the invention, includes a one-conduction type semiconductor substrate, a plurality of epitaxial layers which are stacked on a surface of the substrate and formed with almost no doping, a one-conduction type isolating region which penetrates the epitaxial layers and forms at least first and second island regions, a one-conduction type vertical transistor formed in the first island region, and a photodiode formed in the second island region, wherein a reverse conduction type diffusion region is formed at an inner side of the isolating region forming the first island region, and the transistor is formed in the first island region surrounded by the diffusion region.

An optical semiconductor integrated circuit device of some embodiments of the invention preferably includes that, at the boundary surface between the epitaxial layer that is uppermost among the plurality of epitaxial layers and the epitaxial layer positioned below this uppermost epitaxial layer, a reverse conduction type embedded layer is formed across the boundary surface, and the embedded layer and the diffusion region are joined with each other at ends of the embedded layer.

A method for manufacturing an optical semiconductor integrated circuit device according to some embodiments of the invention includes: preparing a one-conduction type semiconductor substrate, forming a plurality of epitaxial layers with almost no doping on the semiconductor substrate, forming a one-conduction type isolating region that penetrates the epitaxial layers and isolating the epitaxial layers into at least first and second island regions, forming a one-conduction type vertical transistor in the first island region and forming a photodiode in the second island region, wherein a reverse conduction type diffusion region is formed in the first island region from the uppermost epitaxial layer, and the transistor is formed at an inner side of this diffusion region.

According to an optical semiconductor integrated circuit device of some embodiments of the invention, nondoped multilayered epitaxial layers on a semiconductor substrate are isolated into a plurality of island regions, and in the island regions, at least a photodiode and a vertical pnp transistor are formed. The photodiode is preferably formed of nondoped epitaxial layers, so that almost the entire region of the epitaxial layer region can be used as a depletion layer forming region. This can realize a photodiode which can respond at a high speed.

Furthermore, according to an optical semiconductor integrated circuit device of some embodiments of the invention, nondoped multilayered epitaxial layers on a semiconductor substrate are isolated into a plurality of island regions, and at least a photodiode and a vertical pnp transistor are formed in the island regions. In the vertical pnp transistor, an n+ type diffusion region can be formed between a p+ type diffusion region as a collector region and a p+ type isolating region. This can realize a vertical pnp transistor with high voltage endurance within the epitaxial layers that are stacked without doping.

Furthermore, according to the optical semiconductor integrated circuit device of some embodiments of the invention, as mentioned above, a photodiode and a vertical pnp transistor which are different in performance from each other can be improved in performance and formed on one substrate.

Furthermore, according to the manufacturing method for an optical semiconductor integrated circuit device of some embodiments of the invention, multi epitaxial layers are formed without doping on a semiconductor substrate. In at least two island regions of a plurality of island regions isolated by isolating regions, a photodiode and a vertical pnp transistor are formed. In the vertical pnp transistor, an n+ type diffusion region is formed between a p+ type diffusion region as a collector region and a p+ type isolating region. This can realize a vertical pnp transistor having high voltage endurance within the epitaxial layers that are stacked without doping. As a result, a photodiode and a vertical pnp transistor which are different in performance from each other can be improved in performance and formed on one substrate.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/ or advantages of particular embodiments should not be construed as limiting other embodiments or the claims.

BRIEF DESCRIPTION OF THE DRAWINGS

The accompanying figures are provided by way of example, without limiting the broad scope of the invention or various other embodiments, wherein.

DETAILED DESCRIPTION OF THE PREFERRED EMBODIMENTS

Hereinafter, some preferred embodiments of the invention will be described in detail with reference to the accompanying drawings.

Figure 1:
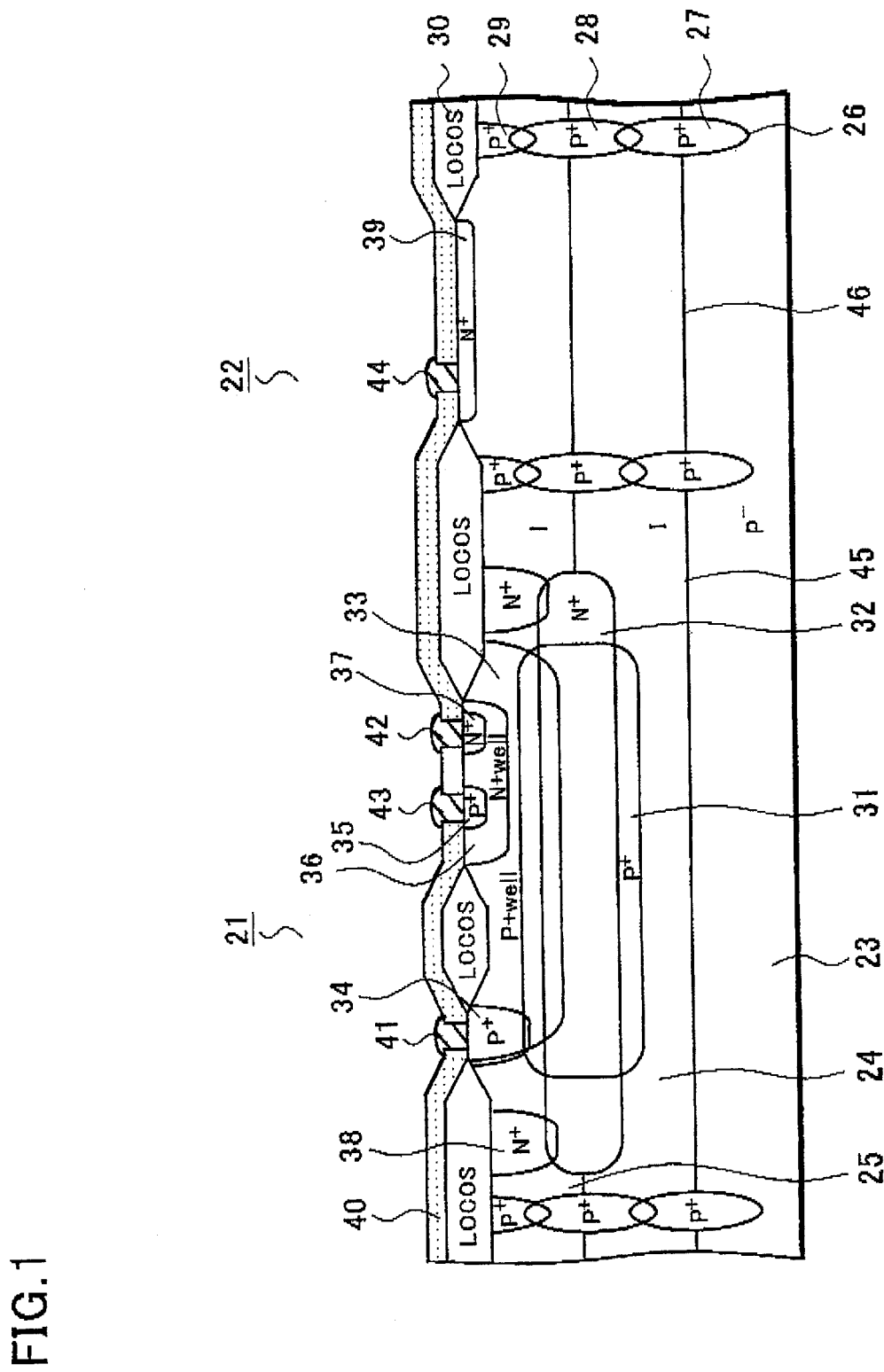
FIG. 1 is a sectional view of an optical semiconductor integrated circuit device according to some embodiments of the invention.

FIG. 1 shows a section of an optical semiconductor integrated circuit device that includes a vertical pnp transistor 21 and a photodiode 22 according to the invention.

As shown in the figure, the integrated circuit device includes a p− type single crystal silicon substrate 23. A first epitaxial layer 24 can be formed on the substrate 23. Layer 24 can have a specific resistance of, for example, about 100 $\Omega \cdot cm$ or more and a thickness of about 6.0 to 8.0 $\mu m$ and can be stacked without doping. On this first epitaxial layer 24, a second epitaxial layer 25 can be formed. Layer 25 has, for example, a specific resistance of 100 $\Omega \cdot cm$ or more and a thickness of 6.0 to 8.0 $\mu m$ and can be stacked without doping. At the substrate 23, first epitaxial layer 24, and second epitaxial layer 25, a first island region 45 and a second island region 46 are preferably formed by a p+ type isolating region 26 completely penetrating these three layers.

This isolating region 26 preferably includes a first isolating region 27 that diffuses vertically from the substrate 23 surface, a second isolating region 28 that diffuses vertically from the first epitaxial layer 24 surface, and a third isolating region 29 that diffuses from the surface of the second epitaxial layer 25. By joining the three isolating regions with each other, the first and second epitaxial layers 24 and 25 are preferably isolated into islands. Preferably, on the p+ type isolating region 26, a LOCOS oxide film 30 can be formed to achieve further isolation between the elements.

In the first island region 45, a vertical pnp transistor 21 is preferably formed, and in the second island region 46, a photodiode 22 is preferably formed. Hereinafter, the structures of these will be described.

First, the photodiode 22 formed in the second island region 46 is described. As shown in FIG. 1, an n+ type diffusion region 39 is preferably formed on almost the entire surface of the second epitaxial layer 25. As mentioned above, the first and second epitaxial layers 24 and 25 are preferably formed without doping, and the diffusion region 39 is preferably used as a cathode region. To the n+ type diffusion region 39, a cathode electrode 44 is preferably connected through a contact hole made in the silicon oxide film 40 on the second epitaxial layer 25 surface. As mentioned above, the substrate 23 is preferably a p− type single crystal silicon substrate, and is preferably joined with the p+ type isolating region 26. An anode electrode is preferably formed on the surface of the isolating region 26 although it is not shown, and the substrate 23 connected to the isolating region 26 is preferably used as an anode region. The isolating region 26 preferably serves as an anode extracting region.

Action of the photodiode 22 is described as follows. For example, a VCC potential, such as +5V, is applied to the cathode electrode 44 of the photodiode 22 and a GND potential is applied to the anode electrode, thereby reverse biasing the photodiode 22. At this point, in the photodiode 22, since the first and second epitaxial layers 24 and 25 have been formed without doping as mentioned above, a depletion layer forming region that is wider than that in the conventional example can be secured. Namely, almost the entire region of the first and second epitaxial layers 24 and 25 formed without doping can be set as a depletion layer forming region. This can reduce the junction capacitance in the photodiode 22 of the invention, so that the depletion layer can be widened. In the condition where reverse bias is applied to the photodiode 22, a depletion layer is widely formed, so that the movement speed of carriers generated by light incidence can be increased. As a result, high-speed response of the photodiode 22 can be realized.

Namely, in the photodiode 22, epitaxial layers formed without doping may be multi-layered. The wider a depletion layer forming region secured, the higher the performance of the photodiode 22, although this depends on the intended use such as light wavelengths.

Next, the vertical pnp transistor 21 formed in the first island region 45 will be described. As shown in FIG. 1, a p+ type embedded layer 31 is preferably formed across the boundary between the first epitaxial layer 24 and the second epitaxial layer 25. Furthermore, in this region, an n+ type embedded layer 32 is preferably formed so as to overlap the p+ type embedded layer 31. In the second epitaxial layer 25, a p+ type well region 33 is preferably formed so as to overlap the p+ type embedded layer 31 at its deep portion. In this p+ type well region 33, a p+ type diffusion region 34 as a collector region, a p+ type diffusion region 35 as an emitter region, and an n+ type well region 36 as a base region are preferably formed. Furthermore, in this n+ type well region 36, as a base extracting region, an n+ type diffusion region 37 is also preferably formed. A silicon oxide film 40 is preferably formed on the surface of the second epitaxial layer 25. Through contact holes made in this oxide film 40, a collector electrode 41, a base electrode 42, and an emitter electrode 43 can be formed. Furthermore, the n+ type diffusion region is preferably connected to a power source (VCC) although this is not shown. Therefore, because the vertical pnp transistor 21 is surrounded by the n+ type regions 32 and 38 to which the power supply potential has been applied, parasitic influence can be suppressed.

The optical semiconductor integrated circuit device of the preferred embodiments of the preferably includes that the n+ type diffusion region 38 is formed so as to surround the region for forming the vertical pnp transistor 21. More specifically, the n+ type diffusion region 38 is preferably formed at the inner side of the isolating regions 26. Namely, at the collector region side, an n type wall is preferably provided between the p+ type diffusion region 34 and the p+ type third isolating region 29. Thereby, the surface of the second epitaxial layer 25 can be prevented from changing into a p type between these regions. As a result, in the epitaxial layers 24 and 25 that are stacked without doping, formation of the vertical pnp transistor 21 can be achieved. This structure will be described below.

As mentioned above, the vertical pnp transistor 21 is preferably formed in the first and second epitaxial layers 24 and 25 that are stacked without doping. In the first and second epitaxial layers 24 and 25, a p+ type well region 33 and an n+ type well region 36 are preferably formed, and a vertical pnp transistor 21 forming region is created. Therefore, in a case where no n+ type diffusion region 38 is formed, for example, between the p+ type well region 33 or p+ type diffusion region 34 and the p+ type isolating region 26, only an intrinsic layer exists. On the silicon oxide layer 40, for example, an Al layer or the like can be formed although these are not shown. In this case, when a current is supplied to the above-mentioned layer, the surface of the second epitaxial layer 25 having a high specific resistance reverses into a p type region. As a result, the p+ type well region 33 or the p+ type diffusion region 34 and the p+ type isolating region 26 short-circuit, and therefore this vertical pnp transistor 21 becomes defective. In this case, the second epitaxial layer 25 has high resistance since it is non-doped, so that the surface reverses into a p type region due to application of a voltage of, for example, 1 to 2V. That is, the structure of this vertical pnp transistor 21 becomes poor in voltage endurance.

However, in the vertical pnp transistor 21 of the preferred embodiments, in the second epitaxial layer 25, an n+ type diffusion region 38 is formed in the intrinsic layer between this p+ type well region 33 or p+ type diffusion region 34 and the p+ type isolating region 26. Therefore, a pn joining region is formed between these two regions and prevents them from short-circuiting even when this intrinsic layer surface changes into a p type region. Namely, at the inner side of the p+ type isolating region 26, an n+ type diffusion region 38 is preferably formed into a circular shape, whereby voltage endurance of the vertical pnp transistor 21 can be significantly improved. Herein, it is not always necessary to form the n+ type diffusion region 38 into a circular shape, and a structure in which the n+ type diffusion region is formed in only a region which can improve voltage endurance of the vertical pnp transistor 21 may be employed. Namely, the vertical pnp transistor 21 is preferably formed in a region substantially surrounded by the n+ type diffusion region 38. In the case of a lateral pnp transistor, the above mentioned structure can also be used, however, in this case, the n+ type diffusion region 38 is preferably used without connection to the power supply. This provides the same effects as in the case with the vertical pnp transistor 21.

As mentioned above, in the optical semiconductor integrated circuit of the preferred embodiments of the invention, the vertical pnp transistor 21 and the photodiode 22 are installed on the same substrate. Therefore, in order to improve performance of the photodiode 22, it is required that the epitaxial layers are formed without doping. On the other hand, to improve voltage endurance of the vertical pnp transistor 21, it is desirable that at least the uppermost epitaxial layer is formed by doping an n type impurity. Therefore, in the optical semiconductor integrated circuit device of the preferred embodiments of the invention, by stacking all epitaxial layers without doping, performance of the photodiode is improved. On the other hand, in the vertical pnp transistor 21, while performance of the photodiode is maintained, the n+ type diffusion region is formed, whereby formation of a vertical pnp transistor having improved voltage endurance on the nondoped epitaxial layers is realized.

As mentioned above, the preferred embodiments includes two epitaxial layers formed without doping, however, the various embodiments of the invention are not especially limited to this. Even when more than two nondoped epitaxial layers are stacked in accordance with the intended use of the photodiode, the same effects can be obtained. Other various changes without departing from the spirit of the invention are possible.

Next, with reference to FIG. 2 through FIG. 10, the method for manufacturing an optical semiconductor integrated circuit device in which a vertical pnp transistor and a photodiode are formed, which is an embodiment of the invention, will be described. In the following description, the same components as described in the optical semiconductor integrated circuit device shown in FIG. 1 shall be attached with the same symbols.

Figure 2:
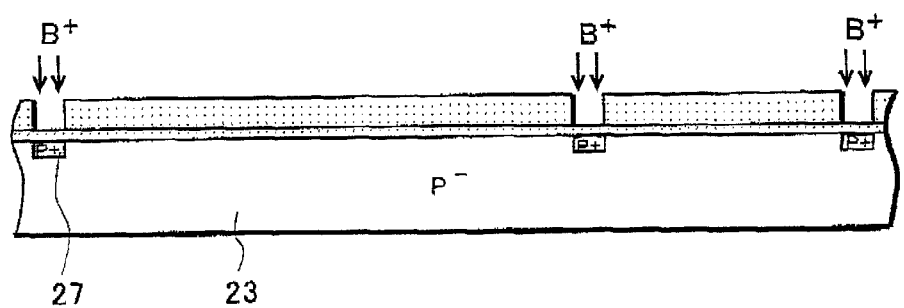
FIGS. 2–10 are used to describe a method for manufacturing an optical semiconductor integrated circuit device according to some embodiments of the invention.

First, as shown in FIG. 2, a p− type single crystal silicon substrate 23 is prepared. Then, an oxide film is preferably formed to, for example, a thickness of about 0.03 to 0.05 $\mu$m on the entire surface of this substrate 23 by, preferably, thermally oxidizing the surface of the substrate 23. Thereafter, by means of a generally known photolithography technique, a photoresist provided with an opening at a portion for forming the first isolating region 27 of the isolating region 26 is preferably formed as a selective mask. Then, a p type impurity, for example, boron (B) is preferably ion-implanted at an accelerating voltage of about 60 to 100 keV by a dose of about $1.0 \times 10^{13}$ to $1.0 \times 10^{15}/cm^2$ and diffused. Thereafter, the photoresist is preferably removed.

Figure 3:
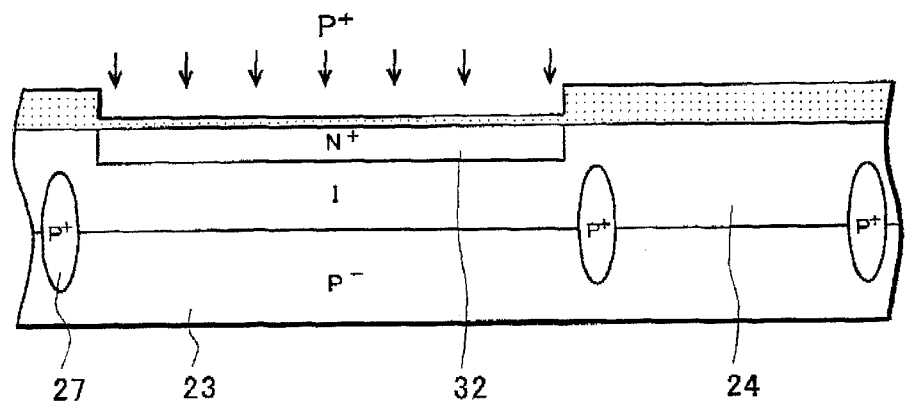

Next, as shown in FIG. 3, after the oxide film shown in FIG. 2 is completely removed, the substrate 23 is preferably placed on a susceptor of an epitaxial growth system. A high temperature of, for example, approximately 1000° C. may be given for the substrate 23 by means of ramp heating, and an SiH$_2$Cl$_2$ gas and an H$_2$ gas can be introduced into the reaction tube. Thereby, a first epitaxial layer 24 with, for example, a specific resistance of about 100 Ω·cm or more and a thickness of about 6.0 to 8.0 $\mu$m can be grown on the substrate 23. Then, the surface of the first epitaxial layer 24 can be thermally oxidized to form a silicon oxide film of about, for example, 0.5 to 0.8 $\mu$m. Thereafter, the oxide film adapted to the n+ type embedded layer 32 of the vertical pnp transistor 21 can be photo-etched to be a selective mask. Thereafter, an n type impurity, for example, phosphorus (P), can be ion-implanted at an accelerating voltage of about 20 to 65 keV by a dose of about $1.0 \times 10^{13}$ to $1.0 \times 10^{15}/cm^2$ and diffused. Then the photoresist is preferably removed. At this point, the first isolating region 27 of the isolating region 26 can be simultaneously diffused.

Figure 4:
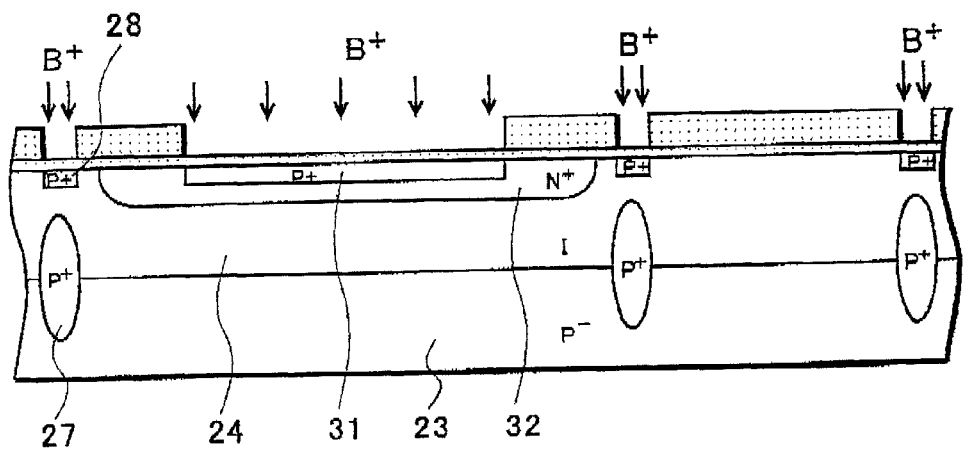

Next, as shown in FIG. 4, on the silicon oxide film formed in FIG. 3, a photoresist provided with openings at portions for forming the p+ type embedded layer 3 of the vertical pnp transistor 21 and the second isolating region 28 of the isolating region 26 can be formed by means of the generally known photo lithography technique as a selecting mask. Then, a p type impurity, for example, boron (B), can be ion-implanted at an accelerating voltage of about 60 to 100 keV by a dose of about $1.0 \times 10^{13}$ to $1.0 \times 10^{15}/cm^2$. Thereafter, the photoresist is removed. At this point, the n+ type embedded layer 32 can be simultaneously diffused.

Figure 5:
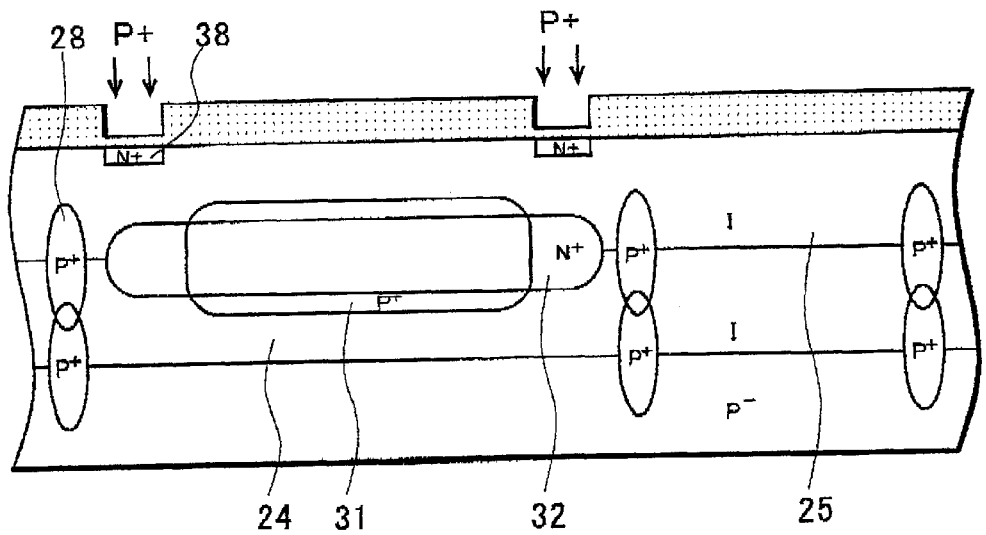

Next, as shown in FIG. 5, after the oxide film is completely removed, the substrate 23 can be placed on a susceptor of an epitaxial growth system. Then, a high temperature of, for example, about 1000° C. can be given for the substrate 23 by means of ramp heating, and an SiH$_2$Cl$_2$ gas and an H$_2$ gas are introduced into the reaction tube. Thereby, a second epitaxial layer 25 with, for example, a specific resistance of about 100 Ω·cm or more and a thickness of about 6.0 to 8.0 $\mu$m is grown. Then, a silicon oxide film can be formed to, for example, a thickness of about 0.5 to 0.8 $\mu$m by thermally oxidizing the surface of the second epitaxial layer 25. Thereafter, the oxide film adapted to the n+ type diffusion region 38 of the vertical pnp transistor 21 can be photo-etched to be a selective mask. Then, an n type impurity, for example, phosphorus (P) can be ion-implanted at an accelerating voltage about 20 to 65 keV by a dose of about $1.0 \times 10^{13}$ to $1.0 \times 10^{15}/cm^2$ and diffused. At this point, the second isolating region 28 of the isolating region 26 and the p+ type embedded layer 31 can be simultaneously diffused. Then, the first and second isolating regions 27 and 28 of the isolating region 26 can be joined with each other.

Figure 6:
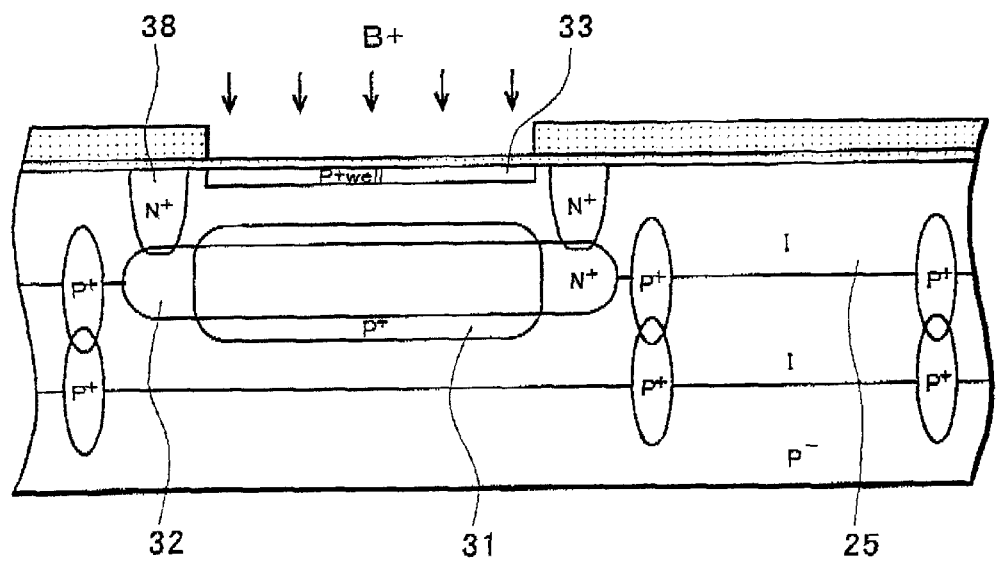

Next, as shown in FIG. 6, the silicon oxide film formed in FIG. 5 can be removed, and the surface of the second epitaxial layer 25 can be thermally oxidized to form an oxide film to, for example, a thickness of about 0.03 to 0.05 $\mu$m on the entire surface. On this oxide film, a photoresist provided with an opening at a portion for forming the p+ type well region 33 of the vertical pnp transistor 21 can be formed as a selective mask by means of the generally known photo lithography technique. Then, a p type impurity, for example, boron (B) can be ion-implanted at an accelerating voltage of about 60 to 100 keV by a dose of about $1.0 \times 10^{13}$ to $1.0 \times 10^{15}/cm^2$ and diffused. Thereafter, the photoresist can be removed. At this point, the n+ type diffusion region 38 can be simultaneously diffused. Then, the n+ type diffusion region 38 and the n+ type embedded layer 32 are joined with each other.

Figure 7:
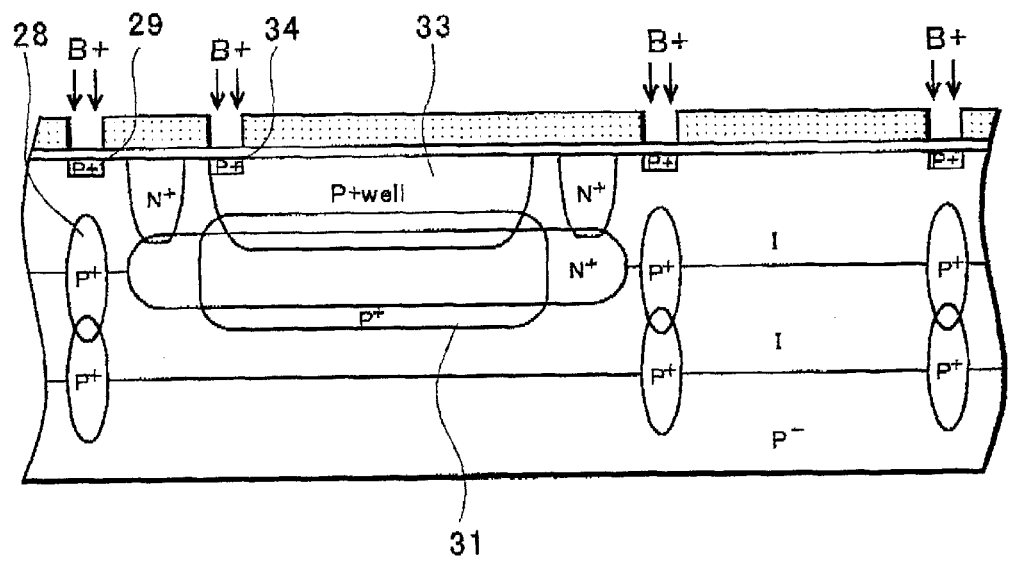

Next, as shown in FIG. 7, on the silicon oxide film formed in FIG. 6, a photoresist provided with openings at portions for forming the p+ type diffusion region 34 that serves as a collector region of the vertical pnp transistor 21 and the third isolating region 29 of the isolating region 26 can be formed as a selective mask by means of the generally known photo lithography technique. Then, a p type impurity, for example, boron (B) can be ion-implanted at an accelerating voltage of about 60 to 100 keV by a dose of about $1.0 \times 10^{13}$ to $1.0 \times 10^{15}/cm^2$ and diffused. Thereafter, the photoresist can be removed. At this point, the p+ type well region 33 can be also simultaneously diffused.

Figure 8:
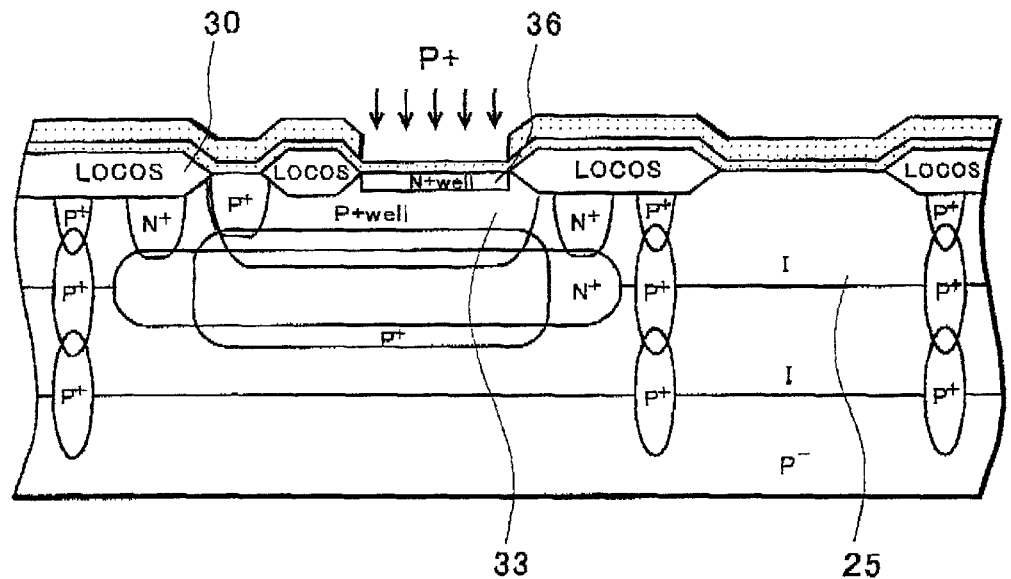

Next, as shown in FIG. 8, a LOCOS oxide film 30 can be formed in a desired region of the second epitaxial layer 25. The surface of the second epitaxial layer 25 can be thermally oxidized to form an oxide film to, for example, a thickness of about 0.03 to 0.05 $\mu$m on the entire surface, although it is not shown. Then, a silicon nitride film can be formed to, for example, a thickness of about 0.05 to 0.2 $\mu$m on this oxide film. Thereafter, the silicon nitride film can be selectively removed so that an opening can be provided at a portion for forming the LOCOS oxide film 30. This silicon nitride film can be used as a mask, and an oxide film can be deposited by means of steam oxidization at, for example, about 800 to 1200° C. from above of the silicon oxide film. Simultaneously, thermal treatment can be applied to the entire substrate 23 to form the LOCOS oxide film 30. Particularly, on the p+ type isolating region 26, by forming the LOCOS oxide film 30, further isolation between the elements can be carried out. Herein, the LOCOS oxide film 20 can be formed to, for example, a thickness of about 0.5 to 1.0 $\mu$m.

Next, the silicon nitride film and the silicon oxide film are completely removed. Thereafter, the surface of the second epitaxial layer 25 can be thermally oxidized again to form an oxide film to, for example, a thickness of about 0.03 to 0.05 $\mu$m on the entire surface. A photoresist provided with an opening at a portion for forming the n+ type well region 36 that serves as a base region of the vertical pnp transistor 21 can be formed as a selective mask on this oxide film by means of the generally known photo lithography technique. Then, an n type impurity, for example, phosphorus (P) can be ion-implanted at an accelerating voltage of about 20 to 65 keV by a dose of about $1.0 \times 10^{13}$ to $1.0 \times 10^{15}/cm^2$. At this point, in a process of ion-implantation of arsenic (As) into the n+ type well region 36, by using a LOCOS oxide film 30 in addition to the photoresist as a selecting mask, ion-implantation can be more accurately carried out into the position of the n+ type well region 36. Thereafter, the photoresist can be removed. At this point, the first, second, and third isolating regions 27, 28, 29 composing the isolating region 26 are joined with each other, whereby the p+ type isolating region 26 can be formed.

Figure 9:
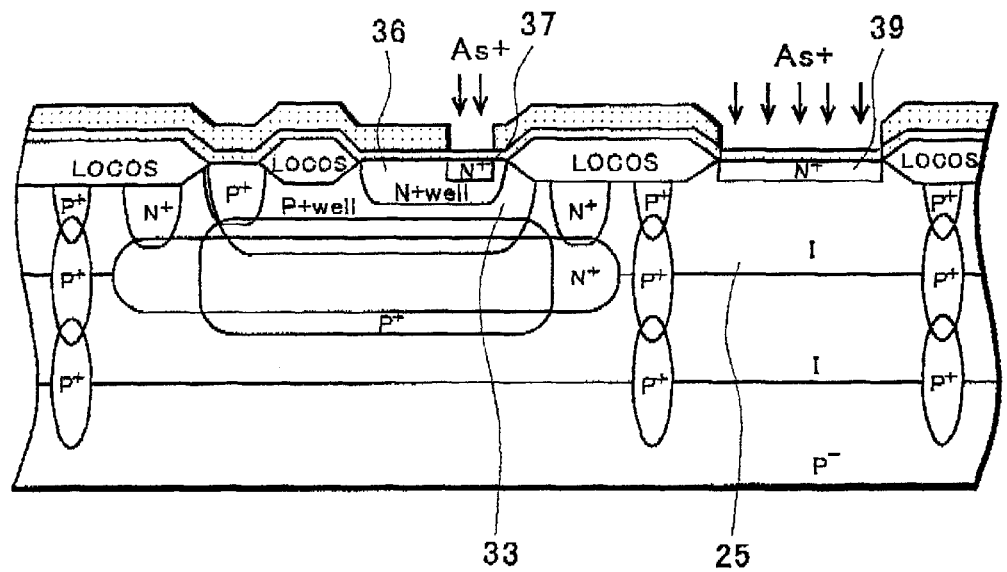

Next, as shown in FIG. 9, on the silicon oxide film formed in FIG. 8, a photoresist provided with openings at portions for forming the n+ type diffusion region 37 that serves as an emitter region of the vertical pnp transistor 21 and the n+ type diffusion region 39 that serves as a cathode region of the photodiode 22 can be formed as a selective mask by means of the generally known photo lithography technique. Then, an n type impurity, for example, arsenic (As) can be ion-implanted at an accelerating voltage of about 80 to 120 keV by a dose of about $1.0 \times 10^{13}$ to $1.0 \times 10^{15}/cm^2$ and diffused. Thereafter, the photoresist can be removed. At this point, the n+ type well region 36 can be also simultaneously diffused.

Figure 10:
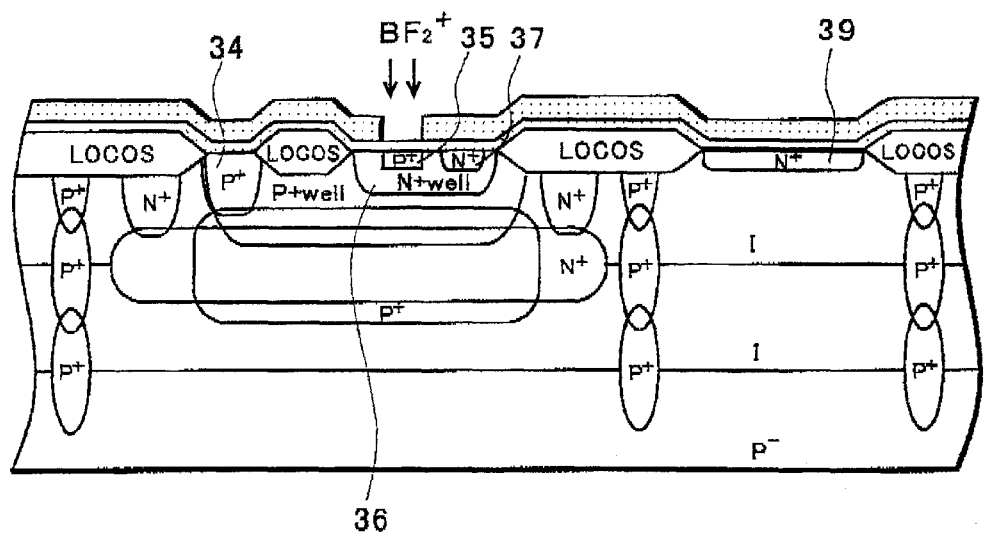
Figure 11:
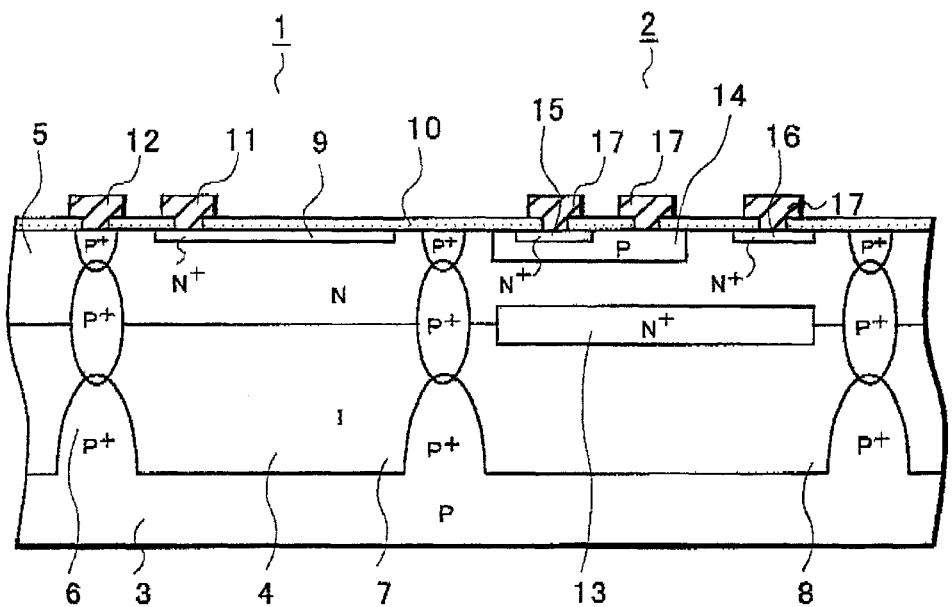
FIG. 11 is a sectional view describing an optical semiconductor integrated circuit device in a conventional example.

Next, as shown in FIG. 10, on the silicon oxide film formed in FIG. 8, a photoresist provided with an opening at a portion for forming the p+ type diffusion region 35 that serves as a base extracting region of the vertical pnp transistor 21 can be formed as a selective mask by means of the generally known photo lithography technique. Then, a p type impurity, for example, boron fluoride ($BF_2$) can be ion-implanted at an accelerating voltage of abut 30 to 75 keV by a dose of about $1.0 \times 10^{15}$ to $1.0 \times 10^{17}/cm^2$ and diffused. Thereafter, the photoresist can be removed. At this point, the n+ type diffusion regions 37 and 39 are simultaneously diffused.

Thereafter, a silicon oxide film 40 can be formed on the surface of the second epitaxial layer 25. Then, in (a) the silicone oxide film 40 on the p+ type diffusion region 34 as a collector region of the vertical pnp transistor 21, (b) the n+ type diffusion region 37 as a base extracting region, and (c) the P+ type diffusion region 35 as an emitter region, contact holes for connection to external electrodes can be formed. In the silicon oxide film 40 on the n+ type diffusion region 39 as a cathode region of the photodiode 22, a contact hole for connection to an external electrode can also be formed. Then, via these contact holes, external electrodes 41, 42, 43, and 44 made from Al can be formed, whereby the optical semiconductor integrated circuit device shown in FIG. 1 in which the vertical pnp transistor 21 and the photodiode 22 have been installed is completed.

Furthermore, in at least some of the above-mentioned embodiments, an optical semiconductor integrated circuit device in which a vertical pnp transistor and a photodiode have been installed is described. However, various embodiments of the invention are not limited to the above mentioned construction. For example, in the case of an IC including other peripheral circuits, similar effects can be obtained.

While illustrative embodiments of the invention have been described herein, the present invention is not limited to the various preferred embodiments described herein, but includes any and all embodiments having modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." Means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited.

What is claimed is:

1. An optical semiconductor integrated circuit, comprising:

a one-conduction type semiconductor substrate;

a plurality of epitaxial layers which are stacked on a surface of said substrate and formed with almost no doping;

a one-conduction type isolating region which penetrates said epitaxial layers and forms at least first and second island regions;

a one-conduction type vertical transistor formed in said first island region; and a photodiode formed in said second island region, wherein a reverse conduction type diffusion region is formed at an inner side of the isolating region forming the first island region, and the transistor is formed in the first island region surrounded by the diffusion region.

2. The optical semiconductor integrated circuit device according to claim 1, wherein the reverse conduction type diffusion region is formed into a substantially circular shape.

3. The optical semiconductor integrated circuit device according to claim 2, wherein, at a boundary surface between the epitaxial layer that is uppermost among the plurality of epitaxial layers and the epitaxial layer positioned below this uppermost epitaxial layer, a reverse conduction type embedded layer is formed across the boundary surface, and the embedded layer and the diffusion region are joined with each other at ends of the embedded layer.

4. The optical semiconductor integrated circuit device according to claim 3, wherein the diffusion region is positioned between a collector region of the transistor and the isolating region.

5. The optical semiconductor integrated circuit device according to claim 3, wherein the specific resistance of the epitaxial layers is about 100 Ω·cm or more.

6. The optical semiconductor integrated circuit device according to claim 2, wherein the diffusion region is positioned between a collector region of the transistor and the isolating region.

7. The optical semiconductor integrated circuit device according to claim 2, wherein the specific resistance of the epitaxial layers is about 100 Ω·cm or more.

8. The optical semiconductor integrated circuit device according to claim 1, wherein, at a boundary surface between the epitaxial layer that is uppermost among the plurality of epitaxial layers and the epitaxial layer positioned below this uppermost epitaxial layer, a reverse conduction type embedded layer is formed across the boundary surface, and the embedded layer and the diffusion region are joined with each other at ends of the embedded layer.

9. The optical semiconductor integrated circuit device according to claim 8, wherein the diffusion region is positioned between a collector region of the transistor and the isolating region.

10. The optical semiconductor integrated circuit device according to claim 8, wherein the specific resistance of the epitaxial layers is about 100 Ω·cm or more.

11. The optical semiconductor integrated circuit device according to claim 1, wherein the diffusion region is positioned between a collector region of the transistor and the isolating region.

12. The optical semiconductor integrated circuit device according to claim 1, wherein the specific resistance of the epitaxial layers is about 100 Ω·cm or more.

13. A manufacturing method for an optical semiconductor integrated circuit device, comprising:
   preparing a one-conduction type semiconductor substrate;
   forming a plurality of epitaxial layers with almost no doping on said semiconductor substrate;
   forming a one-conduction type isolating region that penetrates the epitaxial layers and isolating the epitaxial layers into at least first and second island regions; and
   forming a one-conduction type vertical transistor in said first island region and forming a photodiode in said second island region, wherein
      a reverse conduction type diffusion region is formed in the first island region from the uppermost epitaxial layer, and said transistor is formed at an inner side of this diffusion region.

14. The manufacturing method for an optical semiconductor integrated circuit device according to claim 13, wherein said reverse conduction type diffusion region is formed into a substantially circular shape between said one-conduction type isolating region and said reverse conduction type diffusion region.

15. The manufacturing method for an optical semiconductor integrated circuit device according to claim 14, wherein a reverse conduction type embedded layer is formed across a boundary surface between the uppermost epitaxial layer and the epitaxial layer positioned below this uppermost epitaxial layer in the first island region, and the diffusion region is joined with the embedded layer at ends of the embedded layer.

16. The manufacturing method for an optical semiconductor integrated circuit device according to claim 6, wherein a reverse conduction type embedded layer is formed across a boundary surface between the uppermost epitaxial layer and the epitaxial layer positioned below this uppermost epitaxial layer in the first island region, and the diffusion region is joined with the embedded layer at ends of the embedded layer.

* * * * *